US009157457B2

(12) United States Patent
Hou et al.

(10) Patent No.: US 9,157,457 B2
(45) Date of Patent: Oct. 13, 2015

(54) FAN HOLDER

(71) Applicant: GIGA-BYTE TECHNOLOGY CO., LTD., New Taipei (TW)

(72) Inventors: Chih Jen Hou, New Taipei (TW); Chi Chen Huang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 250 days.

(21) Appl. No.: 13/887,359

(22) Filed: May 5, 2013

(65) Prior Publication Data

US 2014/0178222 A1 Jun. 26, 2014

(30) Foreign Application Priority Data

Dec. 26, 2012 (TW) .............................. 101150226 A

(51) Int. Cl.
  F04D 29/00 (2006.01)
  F04D 29/64 (2006.01)
  F04D 25/06 (2006.01)
  F04D 25/16 (2006.01)
  F04D 29/60 (2006.01)
  F04D 29/66 (2006.01)
  H05K 7/20 (2006.01)

(52) U.S. Cl.
  CPC .......... *F04D 29/646* (2013.01); *F04D 25/0613* (2013.01); *F04D 25/166* (2013.01); *F04D 29/601* (2013.01); *F04D 29/668* (2013.01); *H05K 7/20172* (2013.01)

(58) Field of Classification Search
  CPC .............................. F04D 19/002; F04D 29/522
  USPC .......... 417/423.5, 423.14, 423.15; 415/213.1, 415/220; 361/695
  See application file for complete search history.

(56) References Cited

U.S. PATENT DOCUMENTS

| 2,025,216 | A * | 12/1935 | Opitz .............................. 165/60 |
| 7,170,744 | B2 | 1/2007 | Li |
| 7,301,768 | B2 * | 11/2007 | Fan et al. ...................... 361/695 |
| 7,323,027 | B1 * | 1/2008 | Fu et al. ....................... 55/385.6 |
| 7,522,415 | B2 * | 4/2009 | Fan et al. ...................... 361/695 |
| 8,206,103 | B2 * | 6/2012 | Sun ............................ 415/213.1 |
| 8,517,678 | B2 * | 8/2013 | Li .............................. 415/213.1 |
| 8,708,644 | B2 * | 4/2014 | Ma et al. ...................... 415/119 |
| 2005/0237712 | A1 | 10/2005 | Li |

(Continued)

FOREIGN PATENT DOCUMENTS

| CN | 2695701 Y | 4/2005 |
| TW | 438000 | 5/2001 |
| TW | M407595 U | 7/2011 |

*Primary Examiner* — Charles Freay
*Assistant Examiner* — Christopher Bobish
(74) *Attorney, Agent, or Firm* — Chun-Ming Shih

(57) ABSTRACT

A fan holder includes at least one frame, a first lateral plate, and a second lateral plate. The frame has a first side surface and a second side surface opposite to each other, and the first side surface and the second side surface respectively have a positioning member and a slot. Each frame can be selectively combined with each other through the first side surface and the second side surface. The first lateral plate has a positioning trough, and the second lateral plate has a stopper. The first lateral plate and the second lateral plate are detachably disposed on the first side surface and the second side surface respectively. The positioning member is interlocked with the positioning trough, and the stopper is inserted in the slot. The fan is disposed in the fan holder, and the fan holder is fixed to a case of an electronic device, so as to provide an air flow to cool the electronic device.

13 Claims, 10 Drawing Sheets

(56) References Cited

U.S. PATENT DOCUMENTS

2008/0075589 A1* 3/2008 Chen et al. ............... 415/213.1
2009/0059521 A1* 3/2009 Yin ............................ 361/695
2011/0135461 A1* 6/2011 Li ............................ 415/213.1
2013/0108435 A1* 5/2013 Zhou ........................ 415/213.1

* cited by examiner

FAN HOLDER

CROSS-REFERENCES TO RELATED APPLICATIONS

This non-provisional application claims priority under 35 U.S.C. §119(a) on Patent Application No. 101150226 filed in Taiwan, R.O.C. on 2012 Dec. 26, the entire contents of which are hereby incorporated by reference.

BACKGROUND

1. Technical Field

This disclosure relates to a fan holder, and more particularly to a fan holder, which can be combined with same kind of fan holders.

2. Related Art

With the advance of computer technology, the heat generated by the electronic devices, such as computers or servers, increases as well, which may lead to instability and low performance of the electronic devices. The electronic devices sometimes install multiple integrated circuits, such as CPUs or GPUs, which generate a lot of heat.

On the other hands, in order to protect these electronic components, cases are set up outside these electronic components. Therefore, when the integrated circuits are operating, a lot of heat are generated and can not be exhausted efficiently, such that the operation of these electronic components is affected. Generally, fans are a low-cost and effective cooling device.

In conventional fan modules, multiple fans are disposed in a large frame, and each fan is respectively fixed to the frame by screws in an ordered manner, so as to generate a maximum air flow. The above fan modules provide protection and fixation for the fans, but a lot of hardware cost and installation time are required when the kind of fan module is applied to computer devices requiring multiple fans. Besides, when the fan modules need to uninstall, auxiliary tools like a screwdriver are required, causing a lot of inconvenience.

For different kinds of electronic devices, the positions of the electronic components are different, so the positions of the heat sources are different as well. Therefore, the positions of the fans should be adjusted as well, but fans in conventional fan modules can not adjust according to the positions of the heat sources. At this time, new frames are needed for cooling needs and old frames are replaced, resulting in waste and increased production costs.

Therefore, how to make the fan module flexible and easy-adjusting according to different cooling needs is an important issue for the manufactures of fans and electronic devices.

SUMMARY OF THIS DISCLOSURE

In view of the above problems, this disclosure provides a fan holder to solve the issue that fans in conventional fan modules can not adjust according to the positions of the heat sources. Therefore, new frames are needed for heat needs and old frames are replaced, resulting in waste and increased production costs.

The fan holder includes at least one frame, a first lateral plate, a second lateral plate, and at least one fixing member. The frame includes a first side surface and a second side surface opposite to each other, and the fan is disposed inside the frame. The first side surface has a first positioning member; the second side surface has a first slot; each frame is selectively combined with a second side surface of another adjacent frame by the first side surface of the frame with the first positioning member inserted in the first slot. The first lateral plate includes a first positioning trough; the first lateral plate is detachably disposed to the first side surface, and the first positioning member is interlocked with the first positioning trough. The second lateral plate includes a first stopper; the second lateral plate is detachably disposed to the second side surface, and the first stopper is inserted in the first slot. Both the first lateral plate and the second lateral plate have at least one first keyhole; each first keyhole is penetrated through by a fixing member; the first lateral plate and the second lateral plate are fixed to the case of the electronic device.

The fan holder according to this disclosure can not only assembly and disassembly easily and quickly but also adjust the positions of fans according to cooling needs, so that the operation convenience and flexibility are enhanced and that the cooling effect is increased.

The detail of this disclosure can be better appreciated from the following detailed description of this disclosure, taken in conjunction with the attached drawings.

BRIEF DESCRIPTION OF THE DRAWINGS

This disclosure will become more fully understood from the detailed description given herein below for illustration only, and thus not limitative of this disclosure, wherein.

DETAILED DESCRIPTION OF THE DISCLOSURE

This disclosure includes three embodiments. In these three embodiments, a fan holder will be combined with different components for illustration. People having ordinary skill in the art can make proper modification to the appearance and the combination of the fan holder 100 according to the actual needs or design requirements, not limited as described herein.

Figure 6:
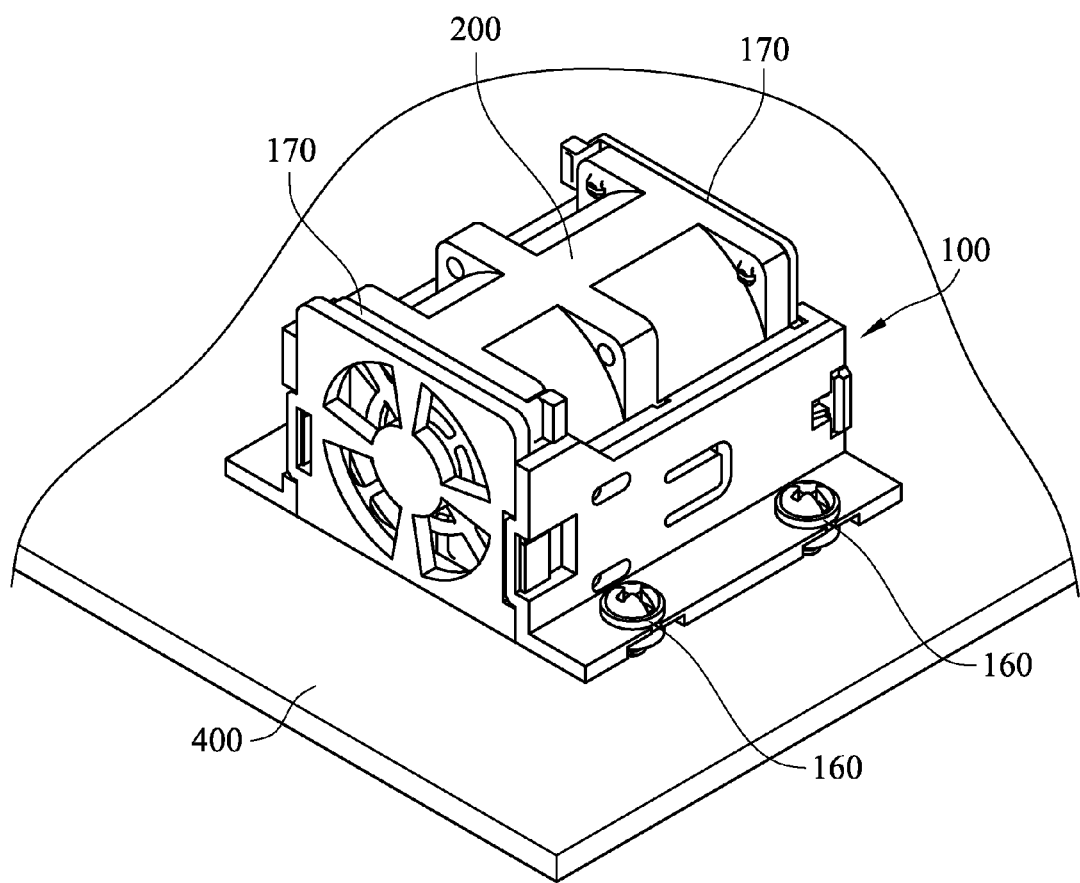
FIG. 6 is a perspective view of the fan holder disposed on the case with a fan inside according to the first embodiment.

Refer to FIG. 6, the fan holder 100 according to the first embodiment is used to set up a fan 200 inside, and the fan holder 100 is disposed in a case 400 of a electronic device, such as a power supply system, a server host, or a test machine, so as to cool the electronic device.

Refer to FIG. 1 to FIG. 6, the fan holder 100 includes at least one frame 110, a first lateral plate 120, and a second lateral plate 130. The frame 110 includes four surfaces and includes a first side surface 120 and a second side surface 130 opposite to each other. The first side surface 111 has a first positioning member 1111, a second stopper 1112, and a cave 1113. The second side surface 112 has a first slot 1121, a second positioning trough 1122, and a fastener 1123, and the positions of the first slot 1121, the second positioning trough 1122, and the fastener 1123 respectively corresponds to those of the first positioning member 1111, the second stopper 1112, and the cave 1113 of the first side surface 111.

Further explain the structure of the frame 110. The first positioning member 1111 and the second stopper 1112 are respectively disposed at the front and rear end of the first side surface 111, and the cave 1113 is disposed between these two; the positions of the first slot 1121, the second positioning trough 1122, and the fastener 1123 of the second side surface 112 respectively corresponds to those of the first positioning member 1111, the second stopper 1112, and the cave 1113.

Figure 1:
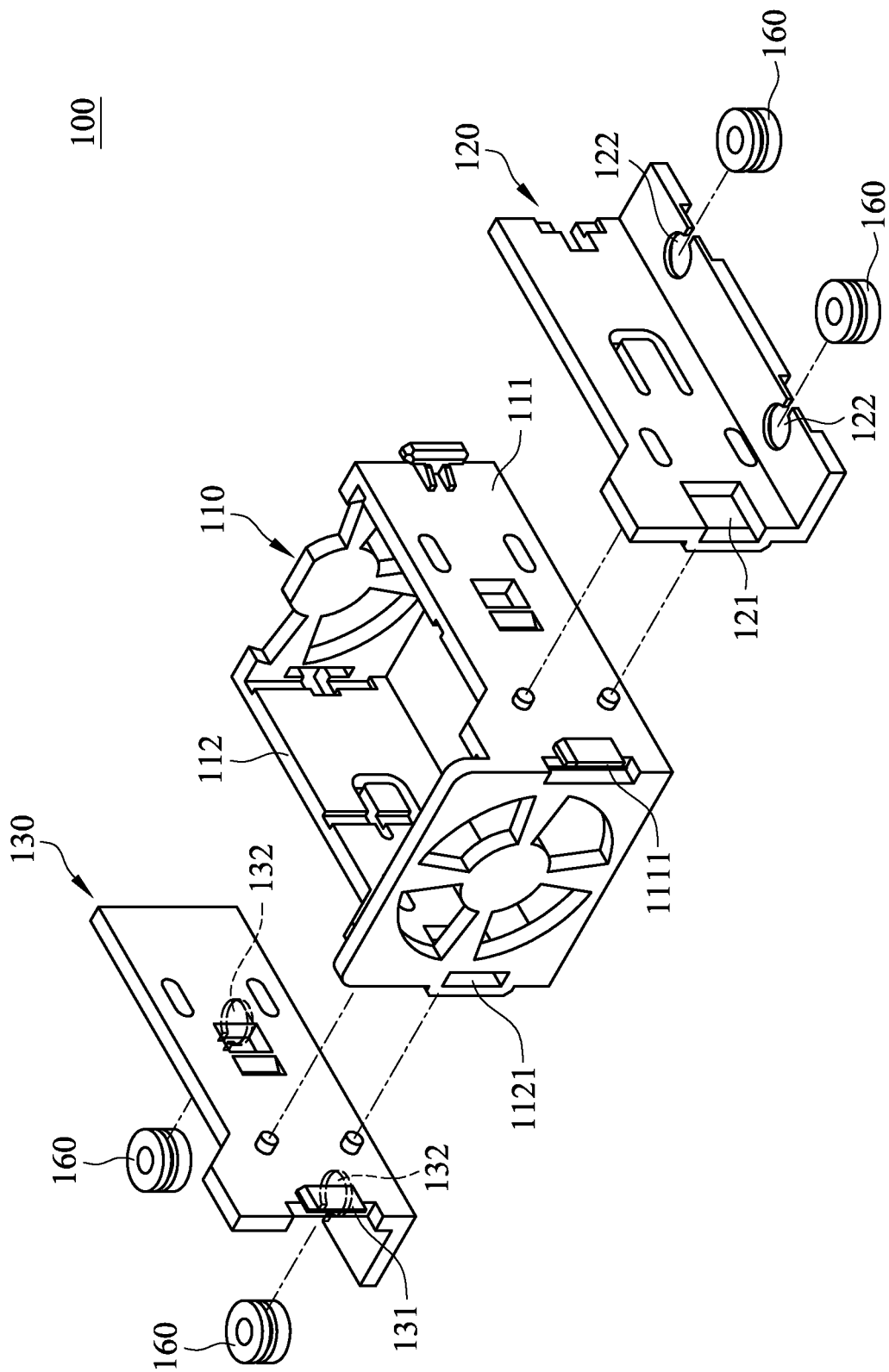
FIG. 1 is an exploded view of the fan holder according to a first embodiment.
Figure 2A:
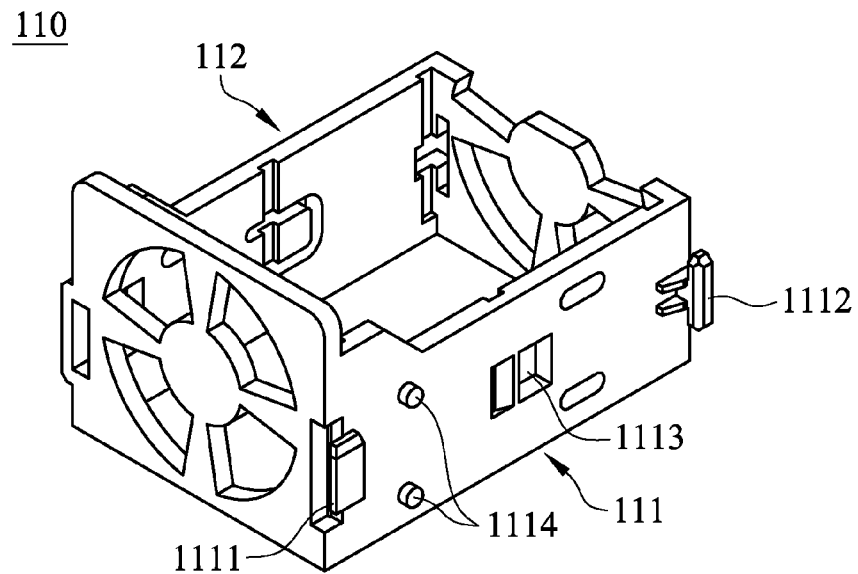
FIG. 2A is a perspective view of the frame of the fan holder according to the first embodiment.
Figure 2B:
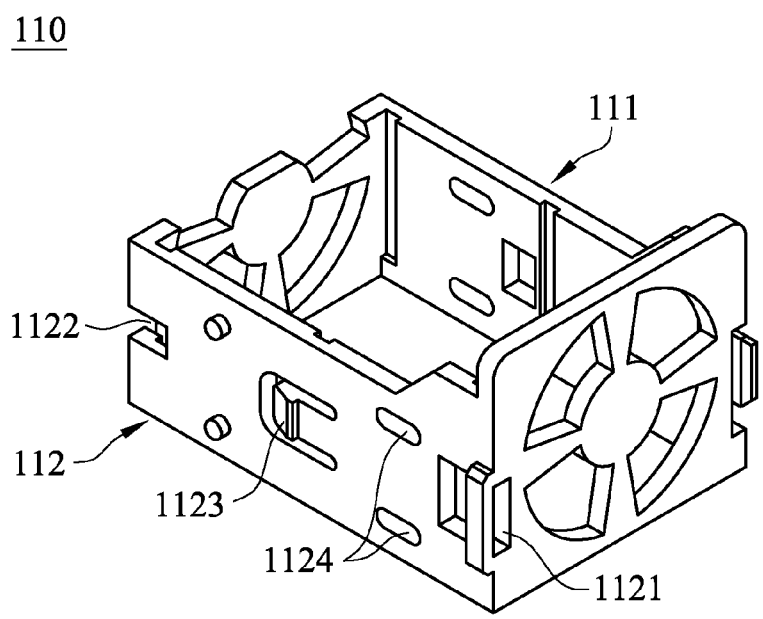
FIG. 2B is a perspective view of the frame of the fan holder from another perspective according to the first embodiment.
Figure 3A:
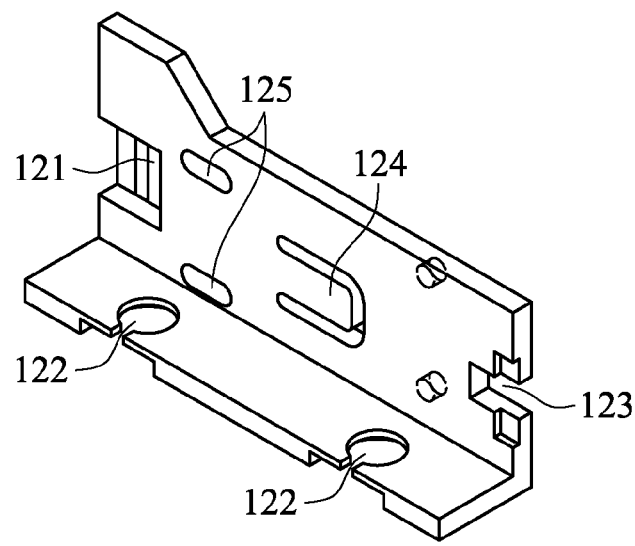
FIG. 3A is a perspective view of the first lateral plate of the fan holder according to the first embodiment.

Refer to FIG. 3A, the first lateral plate 120 is detachably disposed to the first side surface 111 of the frame 110. The first lateral plate 120 has a first positioning trough 121, a second slot 123, and a hook portion 124. The first positioning trough 121 and the second slot 123 are respectively disposed at the front and the rear end of the first lateral plate 120, and the hook portion 124 is disposed between the first positioning trough 121 and the second slot 123. When the first lateral plate 120 is disposed to the first side surface 111, the second stopper 1112 is interlocked with second slot 123, for providing the first lateral plate 120 the guiding and the fixation while users install or uninstall, so as to locate the first lateral plate 120 without deviation. The first positioning member 1111 of the first side surface 111 is interlocked with the first positioning trough 121 as well. Meanwhile, hook portion 124 is stuck in the cave 1113, such that the first lateral plate 120 will not separate from the first side surface 111 of the frame 110.

Figure 3B:
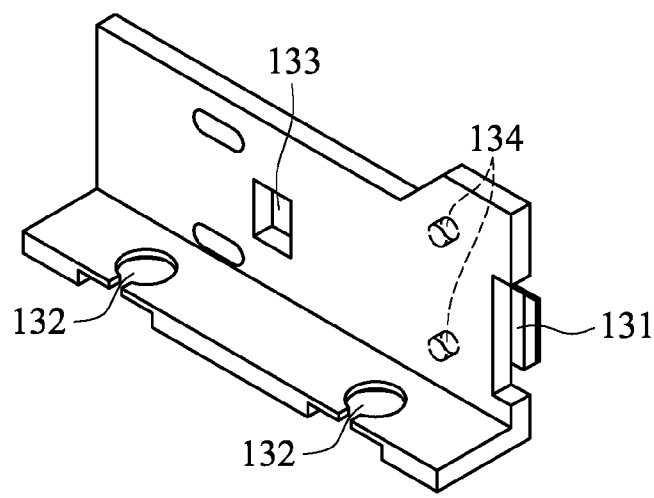
FIG. 3B is a perspective view of the second lateral plate of the fan holder according to the first embodiment.
Figure 4:
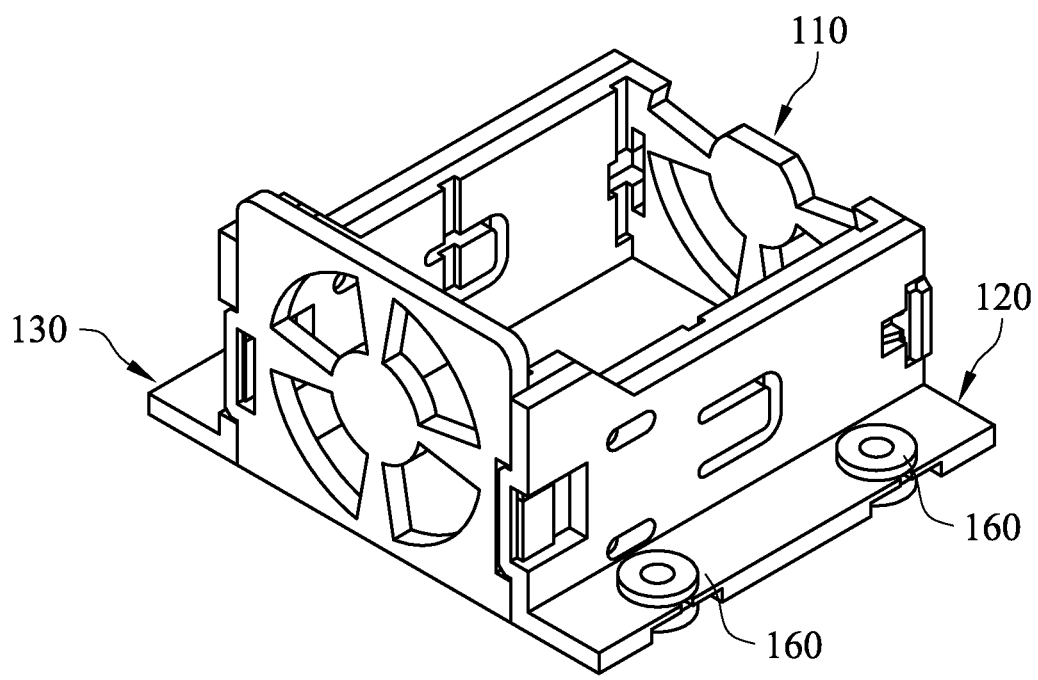
FIG. 4 is a perspective view of the fan holder according to the first embodiment.

Refer to FIG. 3B, the second lateral plate 130 is detachably disposed to the second side surface 112 of the frame 110, and the second lateral plate 130 has a first stopper 131 and an opening 133. The first stopper 131 is disposed to the front end of the second lateral plate 130, and the opening 133 is disposed at the middle part of the second lateral plate 130. When the second lateral plate 130 is disposed to the second side surface 112, the first stopper 131 is inserted in the first slot 1121 of the second side surface 112, for providing the second lateral plate 130 the guiding and the fixation while users install or uninstall. Meanwhile, the fastener 1123 is stuck in the opening 133 as well, so as to locate the second lateral plate 130 without deviation and prevent the second lateral plate 130 from separating from the second side surface 112.

Bothe the first side surface 111 and the second side surface 112 further include a positioning pillar 1114 and a positioning hole 1124, and both the first lateral plate 120 and the second lateral plate 130 further include a positioning hole 125 and a positioning pillar 134. These positioning pillars 1114 and 134 and these positioning holes 1124 and 125 are disposed left-right symmetrical. When the first lateral plate 120 and the second lateral plate 130 are disposed to the first side surface 111 and the second side surface 112 of the frame 110, the positioning pillar 1114 is inserted in the positioning hole 125, and the positioning pillar 134 is inserted in the positioning hole 1124, so as to make the first lateral plate 120 and the second lateral plate 130 be fixed to the frame 110 without deviation.

In one or more examples, both the first lateral plate 120 and the second lateral plate 130 include two first keyholes 122 and 132, and the shapes of the first lateral plate 120 and the second lateral plate 130 are L-shaped. These first keyholes 122 and 132 are perpendicular to the first lateral plate 120 and the second lateral plate 130.

The fan holder 100 further includes a plurality of cushion pads 160. The material of the cushion pads can be an elastic material, such as foam, rubber, silicone, etc, not limited as described herein. The cushion pads are disposed in the first keyholes 122 and 132 of the first lateral plate 120 and the second lateral plate 130. One end of each cushion pad 160 contacts the first lateral plate 120 or the second lateral plate 130, and the other end contacts the case 400. The first lateral plate 120 and the second lateral plate 130 respectively run through these cushion pads 160 and the first keyholes 122 and 132 via two fixing members 300, so that the fan holder 100 is fixed to the case 400 of the electronic device via those first keyholes 122 and 132. When the fan 200 is operating, these cushion pads 160 provide a buffering effect, so as to reduce vibrations of the electronic device. The fixing member 300 includes but not limits to screws and bolts.

Figure 5:
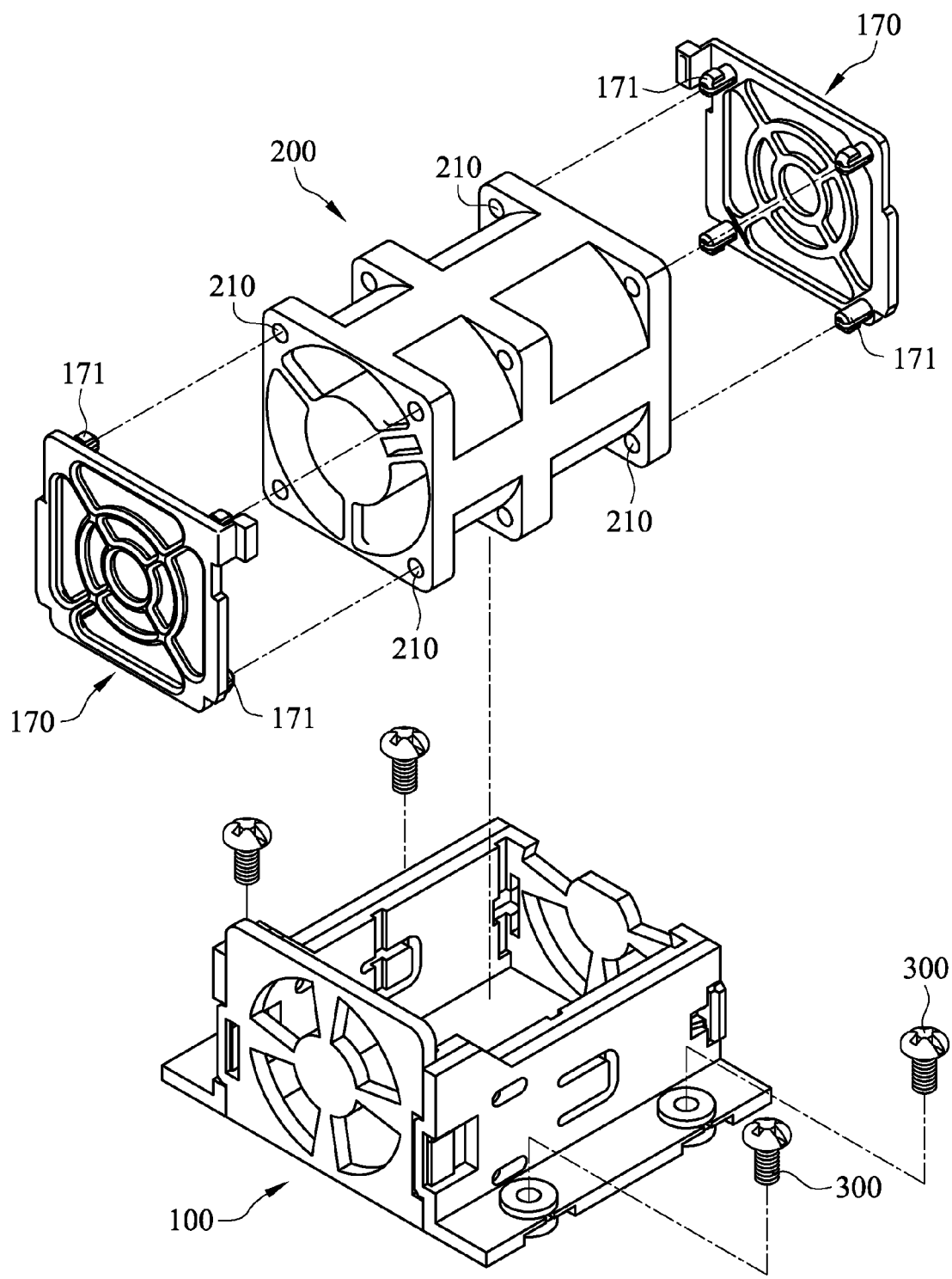
FIG. 5 is an exploded view of the fan and the fan holder according to the first embodiment.

Refer to FIG. 5, the fan holder 100 further includes two fan panel 170 respectively disposed to the air intake surface and air exhaust surface of the fan 200. The two fan panels 170 both have four latches 171 disposed at each corner, and the air intake surface and the air exhaust surface of the fan 200 both have four apertures 210. The latches 171 respectively correspond to each aperture 210 and are inserted in the apertures 171, so as to fix the two fan panels 170 to the fan 200. When the fan 200 is disposed in the fan holder 100, the fan 200 can be fixed in the frame 110 by the two fan panel 170, and the fixing method can be sticking, interlocking, or locking, not limited as described herein.

Figure 7:
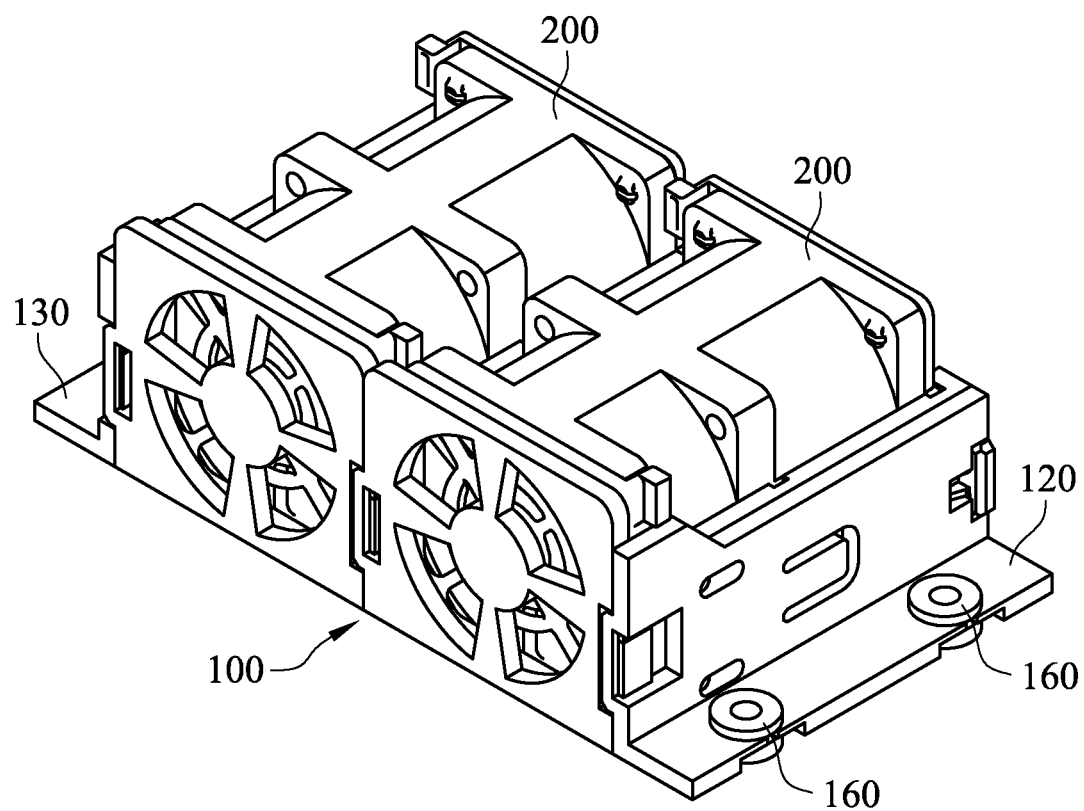
FIG. 7 is a perspective view of two combined fan holders with two fans inside according to the first embodiment.

Refer to FIG. 7. Each frame 110 of the fan holder 100 is selectively combined with a second side surface 112 of another adjacent frame 110 by the first side surface 111 of the frame 110, and the structure of the first side surface 111 matches that of the second side surface 112. When the two frames 110 are combined, the first positioning member 1111 of the first side surface 111 is inserted in the first slot 1121, the second stopper 1112 is interlocked with the second positioning trough 1122, and the fastener is stuck in the cave. Repeat the above combination manner, the fan holder 100 could include any number of the frames 110. People having ordinary skill in the art can make proper modification to the number of the frames 110 according to the actual needs or design requirements, not limited as described herein.

By the combination structure of the frame 110, each frame 110 is selectively combined with each other, or to be combined with two lateral plates 120 or 130, so as to match the cooling needs, enhancing the operation convenience and flexibility.

Figure 8A:
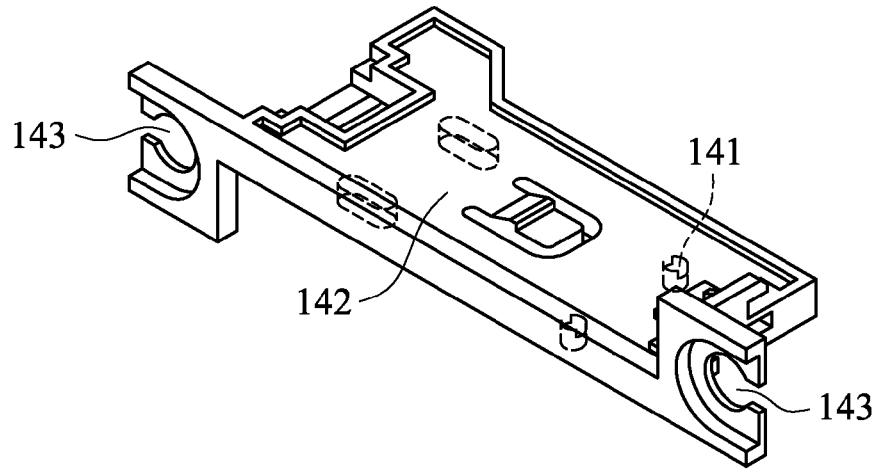
FIG. 8A is a perspective view of the compartment board of the fan holder according to a second embodiment.
Figure 9:
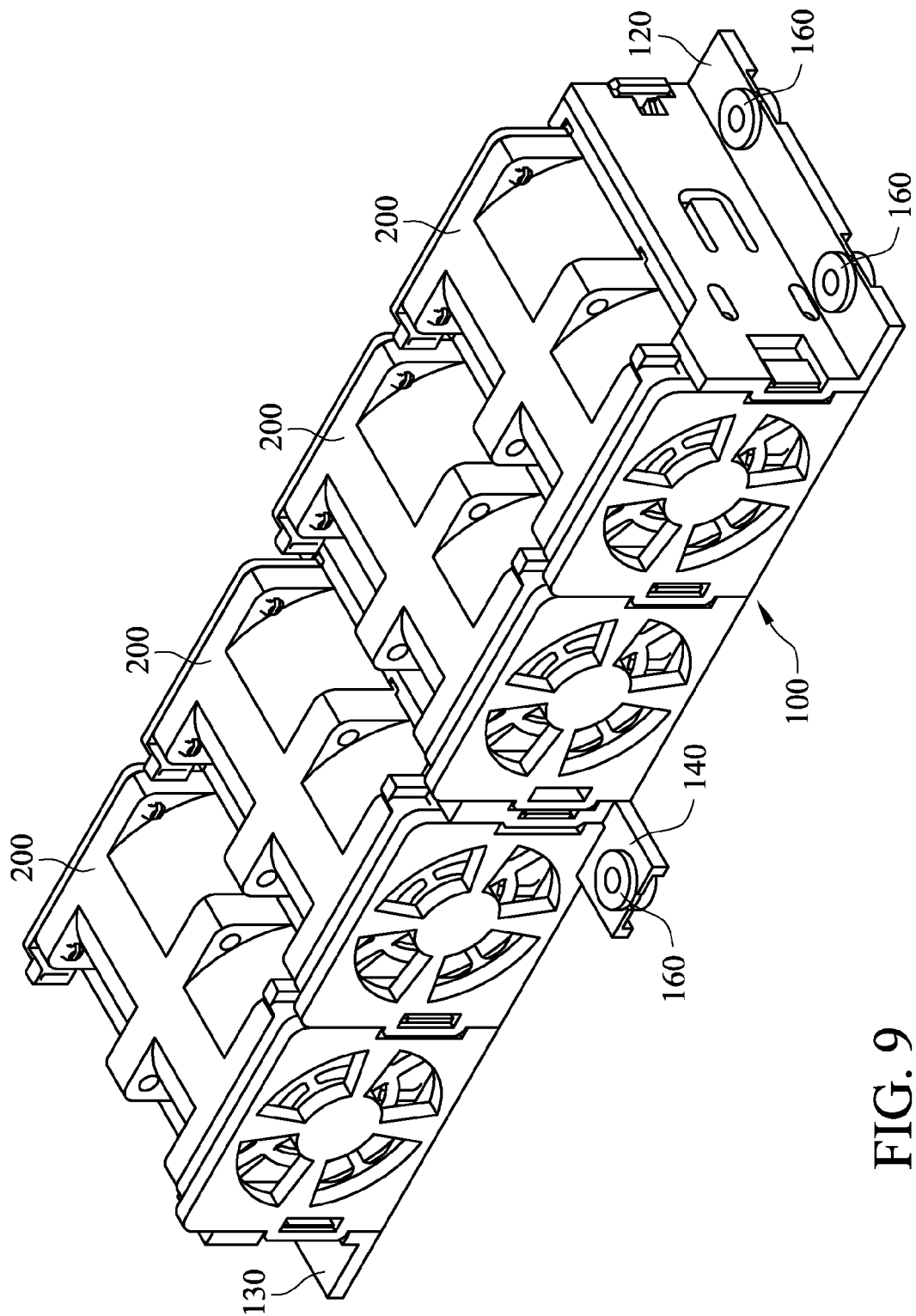
FIG. 9 is a perspective view of the combination of four fan holders and one compartment board with four fans inside according to the second embodiment.

Refer to FIG. 8A and FIG. 9, the structure of the fan holder 100 according to the second embodiment is similar to that of the fan holder 100 according to the first embodiment. The inventor will describe in detail only the difference between the two embodiments.

The fan holder 100 further includes a compartment board 140. The compartment board 140 has a first connecting surface 141 and a second connecting surface 142 connected with each other, and the distance of the two connecting surfaces 141 and 142 equals the wall thickness of the frame 110. The compartment board 140 is selectively disposed between any two frames 110; the first connecting surface 141 is fixed to the second side surface 111 of one adjacent frame 110, and the second connecting surface 142 is fixed to the first side surface 112 of another adjacent frame 110, such that the compartment board 140 is disposed between the two frames 110 and connected to the two adjacent frame 110.

People having ordinary skill in the art can make proper modification to the number and the positions of the compartment boards 140 according to the actual needs or design requirements, not limited as described herein.

Two second keyholes 143 are disposed on the bottom of the compartment board 140 and respectively at the front end and the rear end of the compartment board 140, and the second keyholes 143 are perpendicular to the frame 110. Two cushion pads 160 are respectively disposed in the second keyholes 143, and the compartment board 140 runs through the two second keyhole 143 and the two cushion pads 160 via two fixing members 300, so that the fan holder 100 are fixed to the case 400 of the electronic device by not only the first keyholes 122 and 132 of the two sides 120 and 130 but also the second keyholes 143 of the compartment board 140, so as to provide better fixing effect.

Figure 8B:
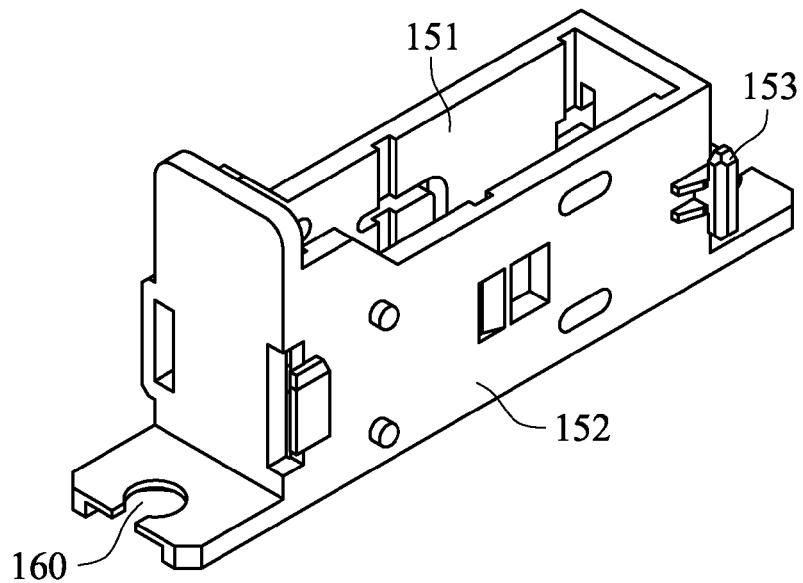
FIG. 8B is a perspective view of the compartment component of the fan holder according to a third embodiment.
Figure 10:
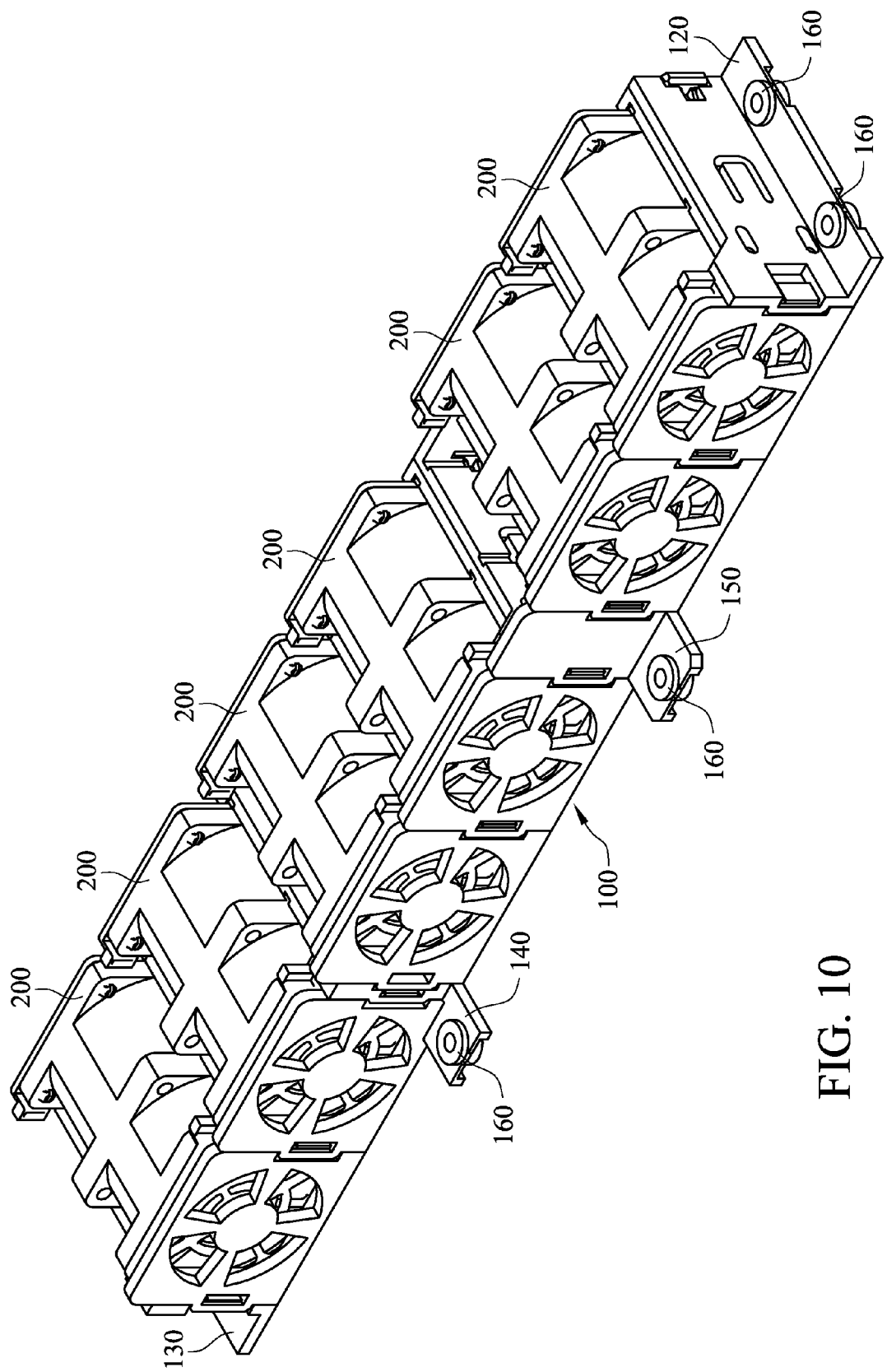
FIG. 10 is a perspective view of the combination of six fan holders, a compartment board, and a compartment component with six fans inside according to the third embodiment.

Refer to FIG. 8B and FIG. 10. The structure of the fan holder 100 according to the third embodiment is similar to that of the fan holder 100 according the first and second embodiment, so the inventor will describe in detail only the difference.

The fan holder 100 further includes a compartment component 150. The compartment component has a first connecting side 151 and a second connecting side 152. The difference between the compartment board 140 and the compartment component 150 is that the distance between the two connecting side 151 and 152 equals half of the distance of the two side 111 and 112 of the frame 110. The compartment component 150 is selectively disposed between any two frames 110; the first connecting side 151 is fixed to the first side surface 111 of one adjacent frame 110, and the second connecting side 152 is fixed to the second side surface 112 of another adjacent frame 110, so that the compartment component 150 is disposed between two frames 110 and connected to the two adjacent frames 110, so as to provide some space to adjust the position of the fans.

Two second keyholes 153 are disposed on the bottom of the compartment component 150 and respectively at the front end and the rear end of the compartment component 150, and the second keyholes 153 are perpendicular to the frame 110. Two cushion pads 160 are respectively disposed in the second keyholes 153, and the compartment component 150 runs through the two second keyholes 153 and the two cushion pads 160 via two fixing members 300, so that the fan holder 100 are fixed to the case 400 of the electronic device by not only the first keyholes 122 and 132 of the two sides 120 and 130 but also the second keyholes 153 of the compartment component 150, so as to provide better fixing effect.

The compartment board 140 and the compartment component 150 can be used together. People having ordinary skill in the art can make proper modification to the numbers and the positions of the compartment boards 140 and the compartment component 150 according to the actual needs or design requirements, not limited as described herein.

By the design of the compartment component 150, one or more compartment component 150 is selectively disposed between the frames 110, such that some space are generated between each fan to adjust the positions of the fans according to the cooling needs.

The technique mean of the combined fan holders solves the issue that the conventional fan module is unable to adjust the positions of the fans according to the positions of the heat sources, so that new frame is needed for cooling needs and the old frame is replaced, resulting in waste and increased production costs.

Compared with the prior art, the fan holder of this disclosure can not only assembly and disassembly easily and quickly but also adjust the positions of fans according to cooling needs, so that the operation convenience and flexibility are enhanced and that the cooling effect is increased.

Though the embodiments of this disclosure are disclosed as described above, this is not to limit this disclosure. People having ordinary skill in the art will recognize that this disclosure can be practiced with modification within the spirit and scope of the claim. It is therefore to be understood that this disclosure is not to be limited by the foregoing description but only by the appended claims.

What is claimed is:

1. A fan holder, disposed in a case of an electronic device, wherein at least one fan is disposed inside the fan holder, comprising:
   at least one frame, including a first side surface and a second side surface facing outward and facing opposite directions, wherein the fan is disposed inside the frame, the first side surface has a first positioning member, the second side surface has a first slot, and the first positioning member and the first slot are paired in which the first positioning member is able to be inserted in a first slot of another frame;
   a first lateral plate, including a first positioning trough, wherein the first lateral plate is detachably disposed to the first side surface with the first positioning member being interlocked with the first positioning trough; and
   a second lateral plate, including a first stopper, wherein the second lateral plate is detachably disposed to the second side surface with the first stopper being inserted in the first slot; and
   wherein both the first lateral plate and the second lateral plate have at least a first keyhole, the first keyhole is penetrated through by a fixing member, and the first lateral plate and the second lateral plate are fixed to the case of the electronic device.

2. The fan holder as claimed in claim 1, further including at least a compartment board, wherein the compartment board has a first connecting surface and a second connecting surface, the distance between the two connecting surfaces equals a wall thickness of the frame, the compartment board is selectively disposed between two frames, the first connecting surface is fixed to the second side surface, and the second connecting surface is fixed to the first side surface.

3. The fan holder as claimed in claim 2, wherein the compartment board further includes at least one second keyhole, each second keyhole is penetrated through by a fixing member and is fixed to the case of the electronic device.

4. The fan holder as claimed in claim 3, further including a plurality of cushion pads, wherein the cushion pads are respectively disposed in the second keyholes and contact the compartment board and the case.

5. The fan holder as claimed in claim 1, further including at least one compartment component, wherein the compartment component has a first connecting side and a second connecting side, the distance between the first connecting side and the second connecting side equals half of the distance between the first side surface and the second side surface of the frame, the compartment component is selectively disposed between two frames, the first connecting side is fixed to the first side surface of one adjacent frame, and the second connecting side is fixed to the second side surface of another adjacent frame.

6. The fan holder as claimed in claim 5, wherein the compartment component further includes at least one second keyhole, each of the second keyholes is penetrated through by a fixing member and is fixed to the case of the electronic device.

7. The fan holder as claimed in claim 6, further including a plurality of cushion pads, wherein the cushion pads are respectively disposed in the second keyholes and contact the compartment component and the case.

8. The fan holder as claimed in claim 1, further including a plurality of cushion pads, wherein the cushion pads are respectively disposed in the first keyholes and respectively contact the first lateral plate and the second lateral plate and the case.

9. The fan holder as claimed in claim 1, further including two fan panels, wherein the two fan panels are disposed at two relative ends of the fan, the two fan panels respectively have a plurality of latches, a plurality of apertures are disposed at two relative ends of the fan, and the latches are respectively inserted in the apertures.

10. The fan holder as claimed in claim 1, wherein the first lateral plate further includes a second slot and a hook portion, the first side surface further includes a second stopper and a cave, the second stopper is interlocked with the second slot, and the hook portion is stuck in the cave.

11. The fan holder as claimed in claim 1, wherein the second lateral plate further includes an opening, the second side surface further includes a fastener, and the fastener is stuck in the opening.

12. The fan holder as claimed in claim 1, wherein the first side surface of the frame further includes a second stopper and a cave, the second side surface further includes a second positioning troughs and a fastener; wherein when each two frames are combined with each other, the second stopper is interlocking with the second positioning trough, and the fastener is stuck in the cave.

13. The fan holder as claimed in claim 1, wherein the first side surface and the second lateral plate further respectively have a positioning pillar, the second side surface and the first lateral plate further respectively include a positioning hole, the positioning pillar of the first side surface is inserted in the positioning hole of the first lateral plate, and the positioning pillar of the second lateral plate is inserted in the positioning hole of the second side surface.

* * * * *